US012707756B2

(12) United States Patent
Rim

(10) Patent No.: US 12,707,756 B2
(45) Date of Patent: Aug. 11, 2026

(54) CONDUCTIVE CONTACTS FOR POLYCRYSTALLINE SILICON FEATURES OF SOLAR CELLS

(71) Applicant: Maxeon Solar Pte. Ltd., Singapore (SG)

(72) Inventor: Seung Bum Rim, Palo Alto, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 19/090,749

(22) Filed: Mar. 26, 2025

(65) Prior Publication Data

US 2025/0228034 A1 Jul. 10, 2025

Related U.S. Application Data

(62) Division of application No. 18/244,073, filed on Sep. 8, 2023, now Pat. No. 12,288,826, which is a division (Continued)

(51) Int. Cl.

*H10F 77/20* (2025.01)
*H10F 71/00* (2025.01)

(Continued)

(52) U.S. Cl.

CPC ......... *H10F 77/211* (2025.01); *H10F 71/121* (2025.01); *H10F 77/122* (2025.01);

(Continued)

(58) Field of Classification Search

CPC .... H10F 77/211; H10F 71/121; H10F 77/122; H10F 77/1642; H10F 77/315;

(Continued)

(56) References Cited

U.S. PATENT DOCUMENTS 4,163,678 A 8/1979 Bube et al.
4,171,989 A 10/1979 Pryor (Continued)

FOREIGN PATENT DOCUMENTS

CN 105794004 A 7/2016
CN 105830226 A 8/2016

(Continued)

OTHER PUBLICATIONS

Wu, Yu et al., "In-situ doping and local overcompensation of high performance LPCVD polysilicon passivated contacts as approach to industrial IBC cells," Energy Procedia 92 (2016) 427-433.

(Continued)

*Primary Examiner* — Michael Y Sun

(57) ABSTRACT

Methods of fabricating conductive contacts for polycrystalline silicon features of solar cells, and the resulting solar cells, are described. In an example, a method of fabricating a solar cell includes providing a substrate having a polycrystalline silicon feature. The method also includes forming a conductive paste directly on the polycrystalline silicon feature. The method also includes firing the conductive paste at a temperature above approximately 700° C. to form a conductive contact for the polycrystalline silicon feature. The method also includes, subsequent to firing the conductive paste, forming an anti-reflective coating (ARC) layer on the polycrystalline silicon feature and the conductive contact. The method also includes forming a conductive structure in an opening through the ARC layer and electrically contacting the conductive contact.

8 Claims, 8 Drawing Sheets

Related U.S. Application Data of application No. 15/859,073, filed on Dec. 29, 2017, now Pat. No. 11,804,558.

(51) Int. Cl.

| | |
|---|---|
| ***H10F 77/122*** | (2025.01) |
| ***H10F 77/164*** | (2025.01) |
| ***H10F 77/30*** | (2025.01) |
| ***H10F 77/70*** | (2025.01) |

(52) U.S. Cl.

CPC ....... *H10F 77/1642* (2025.01); *H10F 77/315* (2025.01); *H10F 77/703* (2025.01)

(58) Field of Classification Search

CPC ...... H10F 77/703; H10F 10/14; H10F 77/164; H10F 77/166; H10F 77/707; H10F 77/93; H10F 71/1221; Y02E 10/546; Y02E 10/547; Y02P 70/50

See application file for complete search history.

(56) References Cited

U.S. PATENT DOCUMENTS

| | | | | |
|---|---|---|---|---|
| 4,200,473 A | 4/1980 | Carlson | | |
| 4,355,196 A | 10/1982 | Chai | | |
| 7,468,485 B1 * | 12/2008 | Swanson | H10F 10/165 | 136/243 |
| 8,723,021 B2 | 5/2014 | Hovel et al. | | |
| 2008/0302412 A1 | 12/2008 | Chen et al. | | |
| 2011/0174369 A1 | 7/2011 | Hovel et al. | | |
| 2012/0270359 A1 | 10/2012 | Kumar et al. | | |
| 2013/0312825 A1 | 11/2013 | Takahashi | | |
| 2014/0109952 A1 * | 4/2014 | Jang | H10F 77/707 | 136/246 |
| 2014/0158188 A1 * | 6/2014 | Kim | H10F 10/148 | 136/255 |
| 2014/0357008 A1 | 12/2014 | Kim et al. | | |
| 2016/0126375 A1 | 5/2016 | Morikawa | | |
| 2017/0092791 A1 | 3/2017 | Kii | | |

FOREIGN PATENT DOCUMENTS

| | | |
|---|---|---|
| JP | 2645953 B2 | 2/1992 |
| JP | 05-259487 | 10/1993 |
| KR | 20100128726 | 12/2010 |
| KR | 10-1159276 | 6/2012 |
| KR | 10-2016-0097919 A | 8/2016 |
| KR | 10-2016-0100957 A | 8/2016 |
| WO | WO 89/12321 | 12/1989 |

OTHER PUBLICATIONS

Kwon, et al., "Investigation of Antireflective Porous Silicon Coating for Solar Cells," International Scholarly Research Network ISRN Nanotechnology (2011), 5 pages.

Lee, et al., "A novel method for crystalline silicon solar cells with low contact resistance and antireflection coating by an oxidized Mg layer," Nanoscale Research Letters (2012), 5 pages.

Ryu, et al., "Optimal indium tin oxide layer as anti reflection coating for crystalline silicon solar cell with shallow emitter," Thin Solid Films 521 (2012), pp. 50-53.

Roman, et al., "Cloaking of solar cell contacts at the onset of Rayleigh scattering," Scientific Reports (2016), 8 pages.

First Action Interview Pre-Interview Communication from U.S. Appl. No. 15/859,073 dated Apr. 12, 2019,12 pgs.

First Action Interview Office Action from U.S. Appl. No. 15/859,073 dated Jul. 18, 2019, 11 pgs.

Final Office Action from U.S. Appl. No. 15/859,073 dated Dec. 31, 2019, 12 pgs.

Non-Final Office Action from U.S. Appl. No. 15/859,073 dated Apr. 16, 2020, 13 pgs.

Final Office Action from U.S. Appl. No. 15/859,073 dated Jan. 25, 2021, 12 pgs.

Non-Final Office Action from U.S. Appl. No. 15/859,073 dated Jun. 10, 2021, 13 pgs.

Office Action from German Patent Application No. 10 2018 251 747.9 dated Jun. 29, 2021, 6 pgs.

Final Office Action from U.S. Appl. No. 15/859,073 dated Dec. 24, 2021, 12 pgs.

Non-Final Office Action from U.S. Appl. No. 15/859,073 dated Aug. 5, 2022, 12 pgs.

Final Office Action from U.S. Appl. No. 15/859,073 dated Mar. 6, 2023, 7 pgs.

Notification of Provisional Rejection from Korean Patent Application No. 10-2018-0168962 dated Sep. 20, 2023, 26 pgs.

First Office Action from Chinese Patent Application No. 201811609856.3 dated Nov. 8, 2023, 10 pgs.

Second Office Action from Chinese Patent Application No. 201811609856.3 dated Apr. 30, 2024, 13 pgs.

Third Office Action from Chinese Patent Application No. 201811609856.3 dated Aug. 15, 2024, 10 pgs.

Office Action for Chinese Patent Application No. 201811609856.3, dated Oct. 31, 2024, 11 pages.

Office Action for U.S. Appl. No. 18/244,073, dated Apr. 25, 2024, 14 pgs.

Final Office Action for U.S. Appl. No. 18/244,073, dated Sep. 10, 2024, 15 pgs.

* cited by examiner

CONDUCTIVE CONTACTS FOR POLYCRYSTALLINE SILICON FEATURES OF SOLAR CELLS

CROSS-REFERENCE TO RELATED APPLICATIONS

This application is a Divisional of U.S. patent application Ser. No. 18/244,073, filed on Sep. 8, 2023, which is a Divisional of U.S. patent application Ser. No. 15/859,073, filed on Dec. 29, 2017, now U.S. Pat. No. 11,804,558, issued on Oct. 31, 2023, the entire contents of which are hereby incorporated by reference herein.

TECHNICAL FIELD

Embodiments of the present disclosure are in the field of renewable energy and, in particular, methods of fabricating conductive contacts for polycrystalline silicon features of solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1A:
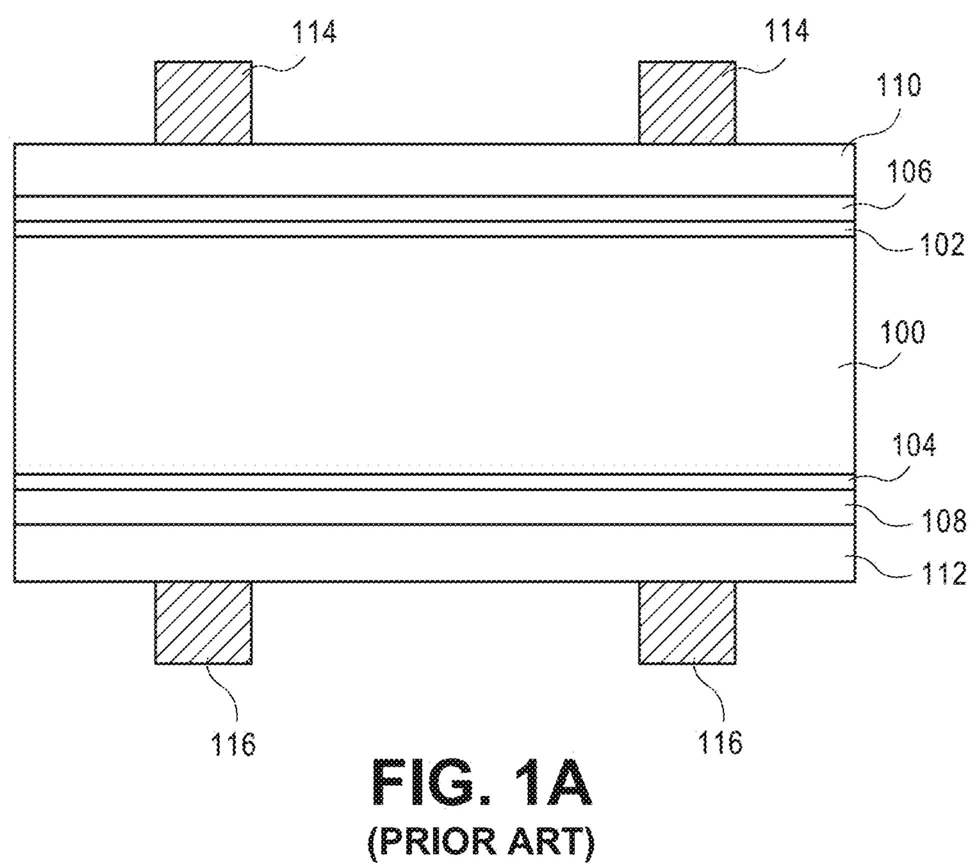
FIGS. 1A-1B illustrate cross-sectional views of various operations in the fabrication of a solar cell.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

Methods of fabricating conductive contacts for polycrystalline silicon features of solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be appreciated that the various embodiments shown in the figures are illustrative representations and are not necessarily drawn to scale.

Disclosed herein are methods of fabricating solar cells. In one embodiment, a method of fabricating a solar cell includes providing a substrate having a polycrystalline silicon feature. The method also includes forming a conductive paste directly on the polycrystalline silicon feature. The method also includes firing the conductive paste at a temperature above approximately 700° C. to form a conductive contact for the polycrystalline silicon feature. The method also includes, subsequent to firing the conductive paste, forming an anti-reflective coating (ARC) layer on the polycrystalline silicon feature and the conductive contact. The method also includes forming a conductive structure in an opening through the ARC layer and electrically contacting the conductive contact.

Also disclosed herein are solar cells. In an embodiment, a solar cell includes a substrate having first and second opposing light-receiving surfaces. A tunnel dielectric layer on the first and second light-receiving surfaces. An N-type polycrystalline silicon layer is on the portion of the tunnel dielectric layer on the first light-receiving surface. A P-type polycrystalline silicon layer is on the portion of the tunnel dielectric layer on the second light-receiving surface. An antireflective coating (ARC) layer is on the N-type polycrystalline silicon layer and on the P-type polycrystalline silicon layer. A first set of conductive contact structures is electrically coupled to the N-type polycrystalline silicon layer. Each of the first set of conductive contact structures includes a conductive structure on a conductive contact on the N-type polycrystalline silicon layer, the conductive structure in an opening in the portion of the ARC layer on the N-type polycrystalline silicon layer, and the conductive contact between the N-type polycrystalline silicon layer and the conductive structure in the opening and between the N-type polycrystalline silicon layer and the portion of the ARC layer on the N-type polycrystalline silicon layer. A second set of conductive contact structures is electrically coupled to the P-type polycrystalline silicon layer. Each of the second set of conductive contact structures includes a conductive structure on a conductive contact on the P-type polycrystalline silicon layer, the conductive structure in an opening in the portion of the ARC layer on the P-type polycrystalline silicon layer, and the conductive contact between the P-type polycrystalline silicon layer and the conductive structure in the opening and between the P-type polycrystalline silicon layer and the portion of the ARC layer on the P-type polycrystalline silicon layer.

In another embodiment, a solar cell includes a substrate having a light-receiving surface and a back side surface. A plurality of alternating N-type and P-type silicon emitter regions is in or above a portion of the back side surface of the substrate. An antireflective coating (ARC) layer is over the plurality of alternating N-type and P-type silicon emitter regions. A plurality of conductive contact structures is electrically coupled to the plurality of alternating N-type and P-type silicon emitter regions, each of the plurality of conductive contact structures including a conductive structure on a conductive contact on a corresponding one of the alternating N-type and P-type silicon emitter regions, the conductive structure in an opening in the ARC layer and extending over the ARC layer, and the conductive contact beneath the conductive structure in the opening and extending beneath a portion of the ARC layer.

In another embodiment, a solar cell includes a substrate having a light-receiving surface and a back side surface. A first polycrystalline silicon emitter region of a first conductivity type is on a first thin dielectric layer on a portion of the back side surface of the substrate. A second polycrystalline silicon emitter region is of a second, different, conductivity type on a second thin dielectric layer in a trench in the back side surface of the substrate, where a portion of the second polycrystalline silicon emitter region overlaps a portion of the first polycrystalline silicon emitter region. An antireflective coating (ARC) layer over the first polycrystalline silicon emitter region and the second polycrystalline silicon emitter region. Conductive contact structures are electrically coupled to the first polycrystalline silicon emitter region and the second polycrystalline silicon emitter region. Each of the conductive contact structures includes a conductive structure on a conductive contact on a corresponding one of the first polycrystalline silicon emitter region and the second polycrystalline silicon emitter region. The conductive structure is in an opening in the ARC layer and extending over the ARC layer, and the conductive contact is beneath the conductive structure in the opening and extending beneath a portion of the ARC layer.

One or more embodiments described herein are directed to high temperature firing of a metal paste for polycrystalline silicon contact solar cells. To provide context, silver (Ag) paste has been used in conventional solar cells broadly in the solar cell fabrication industry. However, high temperature firing of such paste may lead to very high surface recombination of a polycrystalline silicon based emitter region subjected to such firing such that efficiency gains may be limited. It may be advantageous to develop a fabrication scheme that enables use of a high firing temperature while maintaining low surface recombination of a polycrystalline silicon based emitter region.

In an embodiment, new solar cell architectures may permit a high firing temperature based on a process sequence that involves (1) deposition of a polycrystalline silicon layer, (2) dopant diffusion into the polycrystalline silicon layer, (3) printing Ag paste on the polycrystalline silicon layer (or alternatively, Cu paste or resin or Al paste or resin), (4) firing the paste, e.g., at a temperature of around 700° C., (5) deposition of an anti-reflective coating (ARC) layer, such as a silicon nitride (SiN) layer or an amorphous silicon (a-Si) layer or a silicon nitride and silicon dioxide multi-layer stack on the fired paste and polycrystalline silicon, and (6) annealing at a temperature of around 400° C. for passivation. In an embodiment, the resulting solar cell architecture provides metal lines beneath an ARC layer. The process allows high temperature firing of the Ag paste while maintaining low J0 of a resulting polycrystalline silicon contact since passivation is performed at a relatively low temperature anneal after an ARC layer deposition process. In an embodiment, for cell to cell connection, only pads are exposed only by applying a SiN etchant or a welding technique such as laser welding. For example, such an approach may be implemented for ribbon connection, ultrasonic welding, soldering or smart wires in a front contact, pad connection in an interdigitated back contact (IBC) process or for an internal busbar in an IBC. Thus, approaches described herein can be implemented for front contact solar cell fabrication or for back contact solar cell fabrication.

Figure 1B:
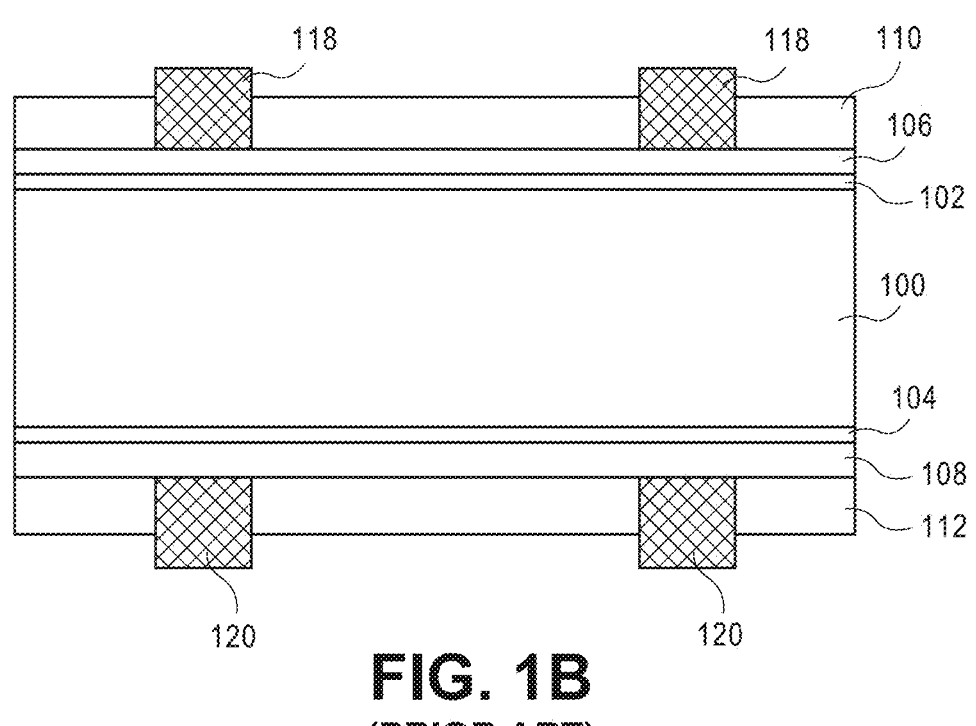

To provide further context, FIGS. 1A-1B illustrate cross-sectional views of various operations in the fabrication of a solar cell.

Referring to FIG. 1A, a substrate 100, such as a silicon substrate, has a first side with a first silicon dioxide layer 102 thereon, and a second side with a second silicon dioxide layer 104 thereon. A first polycrystalline silicon layer 106, such as an N-type polycrystalline silicon layer, is on the first silicon dioxide layer 102. A second polycrystalline silicon layer 108, such as a P-type polycrystalline silicon layer, is on the second silicon dioxide layer 104. A first anti-reflective coating (ARC) layer 110, such as a silicon nitride layer or an amorphous silicon layer, is on the first polycrystalline silicon layer 106. A second ARC layer 112, such as a silicon nitride layer or an amorphous silicon layer, is on the second polycrystalline silicon layer 108.

Referring again to FIG. 1A, first regions 114 of a conductive paste, such as a silver based conducive paste, are on the first ARC layer 110. Second regions 116 of a conductive paste, such as a silver based conductive paste, are on the second ARC layer 112. In an embodiment, the conductive paste includes silver (Ag) powder and a solvent or a resin. In one such embodiment, the conductive paste further includes a glass frit. In another embodiment, the conductive paste does not include a glass frit.

Referring to FIG. 1B, the structure of FIG. 1A is subjected to a firing process, also referred to as a paste firing process. The firing process drives conductive portions of the first regions 114 and the second regions 116 of the conductive paste through the first ARC layer 110 and through the second ARC layer 112, respectively. As a result, conductive contacts 118 and 120 are made to the first polycrystalline silicon layer 106 and the second polycrystalline silicon layer 108, respectively. However, since the firing process is performed with the first 110 and second 112 ARC layers already in place, passivation of the first 106 and second 108 polycrystalline silicon layers may be compromised upon subjecting to a relatively high firing temperature of 700° C. or more.

Embodiments of the present invention may be implemented to fabricate front contact solar cells. In an exemplary process flow, in contrast to the process flow of FIGS. 1A-1B, FIGS. 2A-2D illustrate cross-sectional views and a plan view of various operations in the fabrication of a solar cell, in accordance with an embodiment of the present disclosure.

Figure 2A:
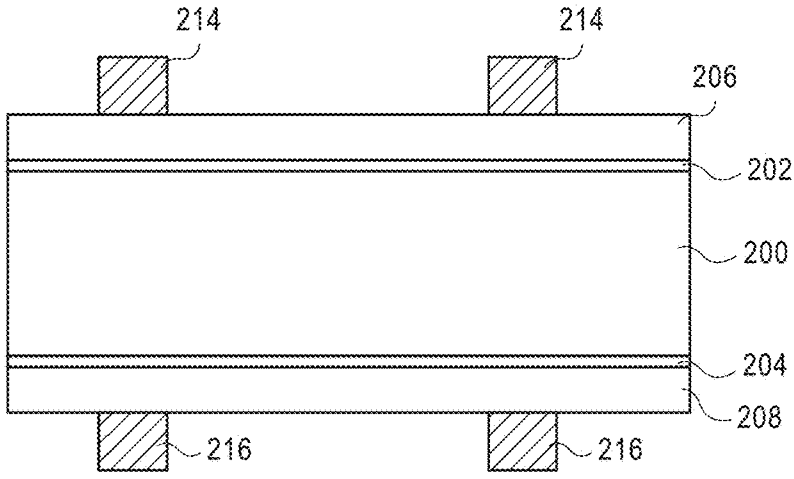
FIGS. 2A-2D illustrate cross-sectional views and a plan view of various operations in the fabrication of a solar cell, in accordance with an embodiment of the present disclosure.

Referring to FIG. 2A, a substrate 200, such as a silicon substrate, has a first side with a first silicon oxide or silicon dioxide layer 202 thereon, and a second side with a second silicon oxide or silicon dioxide layer 204 thereon. A first polycrystalline silicon layer 206, such as an N-type polycrystalline silicon layer, is on the first silicon oxide or silicon dioxide layer 202. A second polycrystalline silicon layer 208, such as a P-type polycrystalline silicon layer, is on the second silicon oxide or silicon dioxide layer 204.

Referring again to FIG. 2A, first regions 214 of a conductive paste, such as a silver based conducive paste, are formed on the first polycrystalline silicon layer 206. Second regions 216 of a conductive paste, such as a silver based conductive paste, are on the second polycrystalline silicon layer 208. In an embodiment, the conductive paste includes silver (Ag) powder and a solvent or a resin. In one such embodiment, the conductive paste further includes a glass frit. In another embodiment, the conductive paste does not include a glass frit.

Figure 2B:
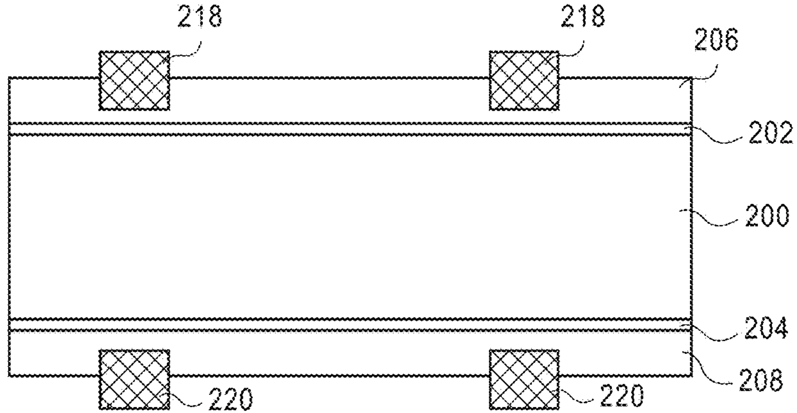

Referring to FIG. 2B, the structure of FIG. 2A is subjected to a firing process, also referred to as a paste firing process. In an embodiment, the firing process is performed at a temperature at or above 700° C., such as between 700 and 800° C.. The firing process drives conductive portions of the first regions 214 and the second regions 216 of the conductive paste into the first polycrystalline silicon layer 206 and the second polycrystalline silicon layer 208, respectively. As a result, conductive contacts 218 and 220 are made to the first polycrystalline silicon layer 206 and the second polycrystalline silicon layer 208, respectively.

Figure 2C:
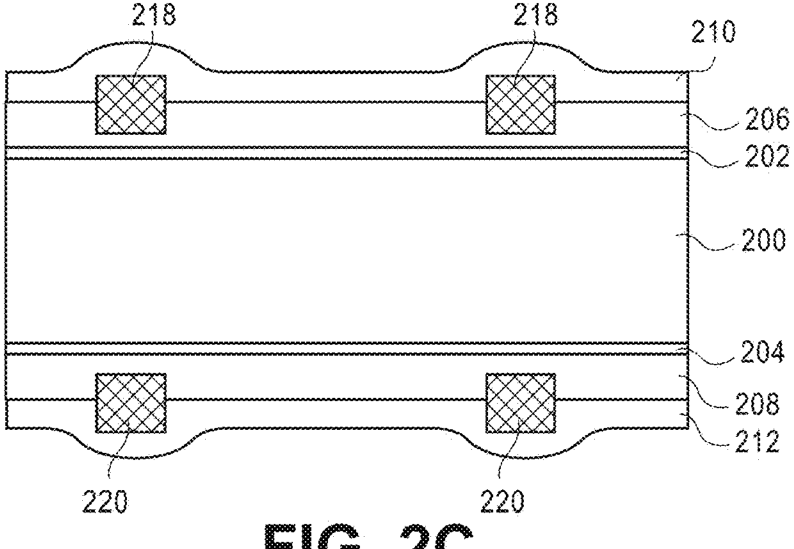

Referring to FIG. 2C, a first anti-reflective coating (ARC) layer 210, such as a silicon nitride layer or an amorphous silicon layer, is formed on the first polycrystalline silicon layer 206 and on the conductive contacts 218. A second ARC layer 212, such as a silicon nitride layer or an amorphous silicon layer, is on the second polycrystalline silicon layer 208 and on the conductive contacts 220. In an embodiment, an anneal process, such as an anneal process performed at a temperature of approximately 400° C., is performed subsequent to forming the first 210 and second 212 ARC layers. In one embodiment, since the firing process has already been performed, the relatively lower temperature anneal process is sufficient for final annealing, and is not at such a high temperature as to diminish good passivation of the first 206 and second 208 polycrystalline silicon layers.

Figure 2D:
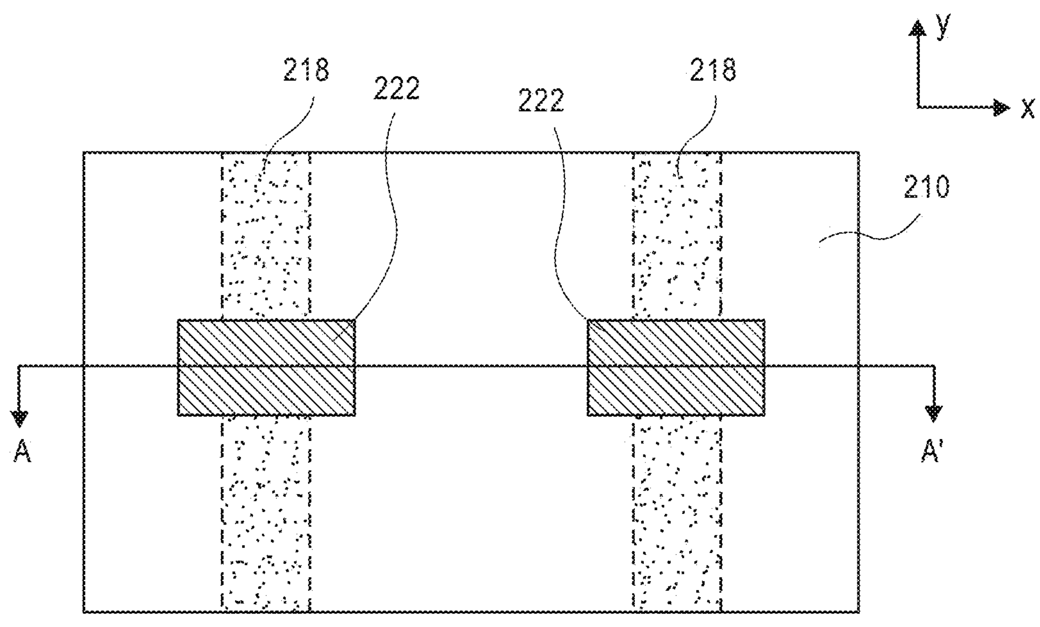
Figure 2D:
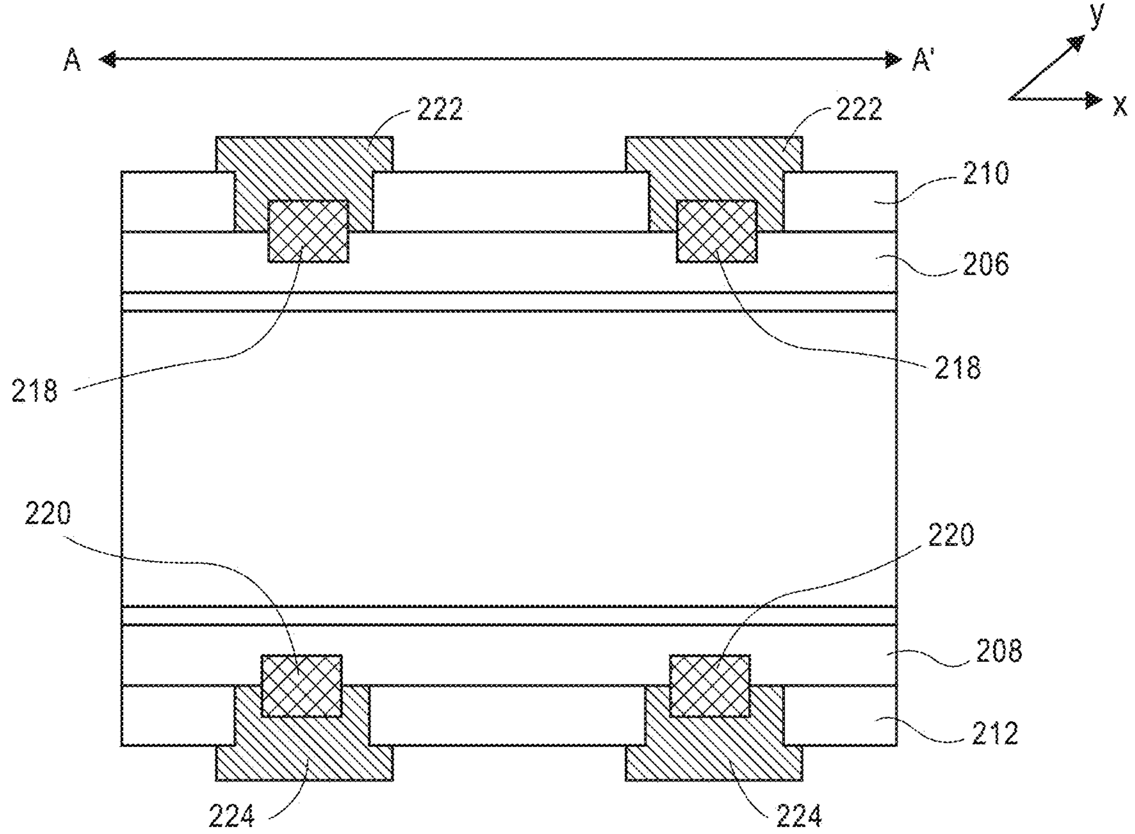

Referring to FIG. 2D, in order to make contact to the conductive contacts 218 and conductive contacts 220, an opening may be made in the first 210 and second 212 ARC layers. A conductive structure 222 or 224, such as a foil, electroplated region, or ribbon may be electrically connected to the conductive contacts 218 and conductive contacts 220, respectively, through the openings. In an embodiment, the opening does not expose the entirety of the conductive contacts 218 or conductive contacts 220. As such, along a y direction, portions of the conductive contacts 218 or conductive contacts 220 are not exposed by an opening and instead are between the first polycrystalline silicon layer 206 or the second polycrystalline silicon layer 208, respectively, and the corresponding ARC layer 210 or 212, respectively.

Referring again to FIGS. 2A-2D, a solar cell includes a substrate 200 having first and second opposing light-receiving surfaces. A tunnel dielectric layer 202/204 is on the first and second light-receiving surfaces. An N-type polycrystalline silicon layer 206 is on the portion 202 of the tunnel dielectric layer on the first light-receiving surface. A P-type polycrystalline silicon layer 208 is on the portion 204 of the tunnel dielectric layer on the second light-receiving surface. An antireflective coating (ARC) layer 210/212 is on the N-type polycrystalline silicon layer and on the P-type polycrystalline silicon layer.

Referring again to FIG. 2D, a first set of conductive contact structures 218/222 is electrically coupled to the N-type polycrystalline silicon layer 206. Each of the first set of conductive contact structures 218/222 includes a conductive structure 222 on a conductive contact 218 on the N-type polycrystalline silicon layer 206. The conductive structure 222 is in an opening in the portion 210 of the ARC layer on the N-type polycrystalline silicon layer 206. The conductive contact 218 is between the N-type polycrystalline silicon layer 206 and the conductive structure 222 in the opening, and is between the N-type polycrystalline silicon layer 206 and the portion 210 of the ARC layer on the N-type polycrystalline silicon layer 206.

A second set of conductive contact structures 220/224 is electrically coupled to the P-type polycrystalline silicon layer 208. Each of the first set of conductive contact structures 220/224 includes a conductive structure 224 on a conductive contact 220 on the P-type polycrystalline silicon layer 208. The conductive structure 224 is in an opening in the portion 212 of the ARC layer on the P-type polycrystalline silicon layer 208. The conductive contact 220 is between the P-type polycrystalline silicon layer 208 and the conductive structure 224 in the opening, and is between the P-type polycrystalline silicon layer 208 and the portion 212 of the ARC layer on the P-type polycrystalline silicon layer 208.

In an embodiment, one or both of the first and second light-receiving surfaces is texturized, as is described in greater detail below in association with FIGS. 3A-3F. In an embodiment, the conductive contact 218 of each of the first set of conductive contract structures 218/222 includes silver (Ag), and the conductive contact 220 of each of the second set of conductive contract structures 220/224 includes silver (Ag). In an embodiment, the ARC layers 210/212 include silicon nitride or amorphous silicon. In an embodiment, substrate 200 is a monocrystalline silicon substrate, and the tunnel dielectric layer is a silicon oxide layer.

A front contact process may involve formation of a double sided textured wafer. In an exemplary process flow, FIGS. 3A-3F illustrate cross-sectional views of various operations in the fabrication of a solar cell, in accordance with an embodiment of the present disclosure.

Figure 3A:
FIGS. 3A-3F illustrate cross-sectional views of various operations in the fabrication of a solar cell, in accordance with an embodiment of the present disclosure.

Referring to FIG. 3A, a method of fabricating a solar cell involves providing a substrate 300. In an embodiment, the substrate 300 is an N-type monocrystalline silicon substrate. In an embodiment, the substrate 300 has a first light-receiving surface 302 and a second light-receiving surface 304.

Figure 3B:
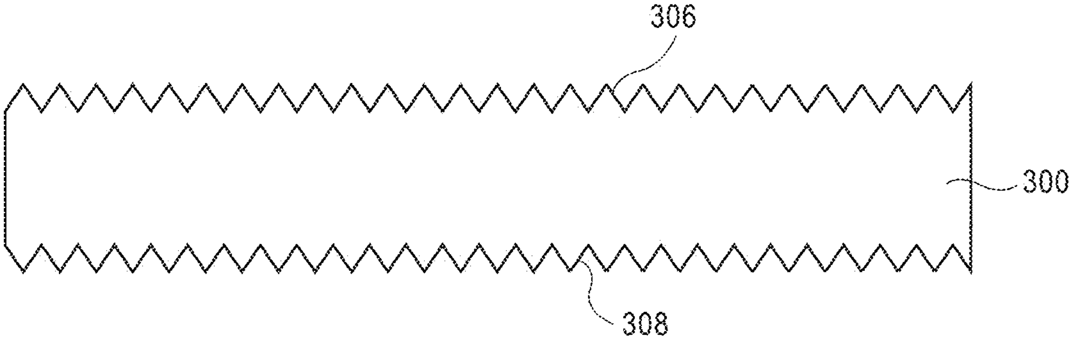

Referring to FIG. 3B, one or both of the light-receiving surfaces 302 and 304 are texturized to provide first texturized light-receiving surface 306 and second texturized light-receiving surface 308, respectively, where both are shown as being texturized in FIG. 3B. In an embodiment, a hydroxide-based wet etchant is employed to texturize the light receiving surfaces 302 and 304 of the substrate 300.

Figure 3C:
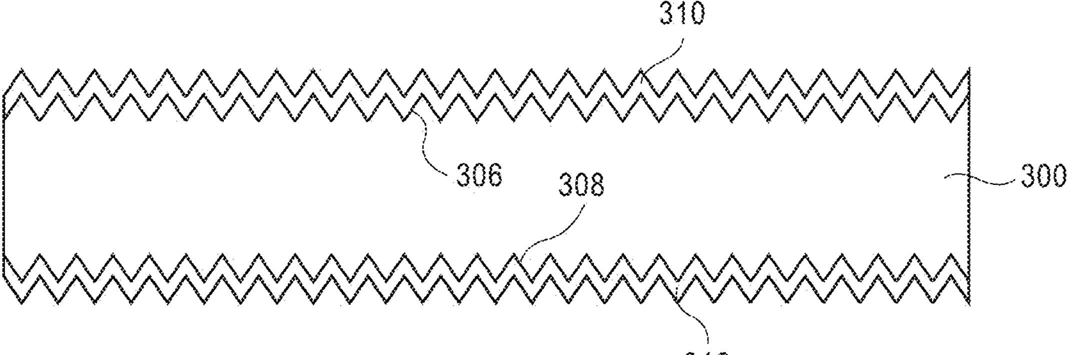

Referring to FIG. 3C, a tunnel dielectric layer 310 is formed on the first texturized light-receiving surface 306 and the second texturized light-receiving surface 308. In an embodiment, the tunnel dielectric layer 310 is a wet chemical silicon oxide layer, such as formed from wet chemical oxidation of the silicon of the first texturized light-receiving surface 306 and the second texturized light-receiving surface 308. In another embodiment, the tunnel dielectric layer 310 is a deposited silicon oxide layer, such as a silicon oxide layer formed from chemical vapor deposition on the first texturized light-receiving surface 306 and on the second texturized light-receiving surface 308. In another embodiment, the tunnel dielectric layer 310 is a thermal silicon oxide layer, such as a thermal silicon oxide layer formed from thermal oxidation of the silicon of the first texturized light-receiving surface 306 and the second texturized light-receiving surface 308. In other embodiments, the tunnel dielectric layer is a nitrogen doped $SiO_2$ layer or other dielectric material such as a silicon nitride layer.

Figures 3D, 3E, 3F:
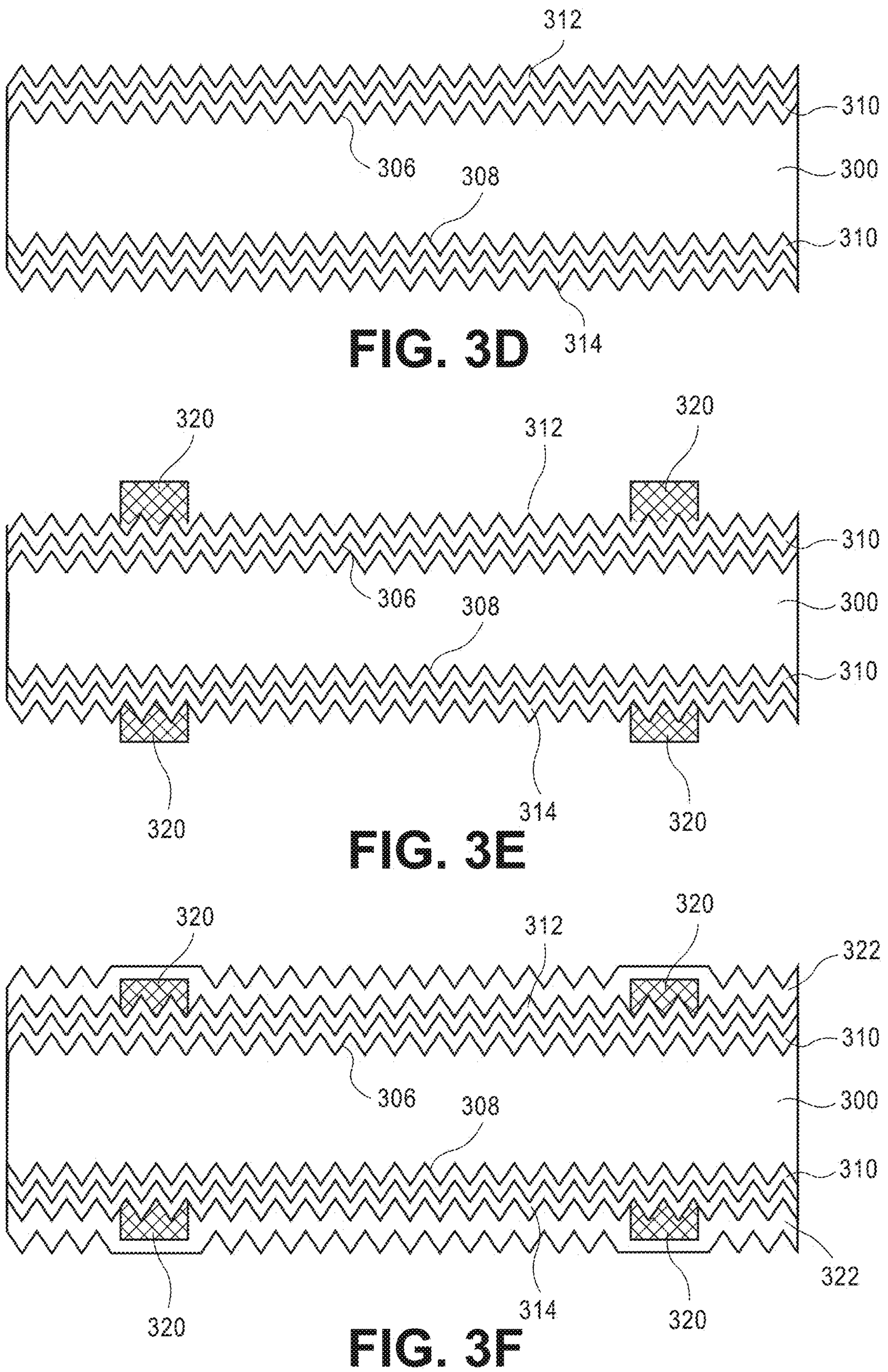

Referring to FIG. 3D, a first polycrystalline silicon layer 312 of a first conductivity type is formed on the portion of the tunnel dielectric layer 310 formed on the first texturized light-receiving surface 306. A second polycrystalline silicon layer 314 of a second conductivity type is formed on the portion of the tunnel dielectric layer 310 formed on the second texturized light-receiving surface 308. In an embodiment, the first polycrystalline silicon layer 312 is an N-type polycrystalline silicon layer, and the second polycrystalline silicon layer 314 is a P-type polycrystalline silicon layer. In an embodiment, the first polycrystalline silicon layer 112 and the second polycrystalline silicon layer 314 are formed by chemical vapor deposition as undoped polycrystalline silicon layers that are subsequently doped as N-type (e.g., with arsenic or phosphorous atoms) or P-type (boron atoms).

Referring to FIG. 3E, regions of a conductive paste, such as a silver based conducive paste, are formed on the first polycrystalline silicon layer 312 and the second polycrystalline silicon layer 314. In an embodiment, the conductive paste includes silver (Ag) powder and a solvent or a resin. In one such embodiment, the conductive paste further includes a glass frit. In another embodiment, the conductive paste does not include a glass frit. The structure is then subjected to a firing process, also referred to as a paste firing process. In an embodiment, the firing process is performed at a temperature at or above 700° C., such as between 700 and 800° C.. The firing process drives conductive portions of the regions of the conductive paste into the first polycrystalline silicon layer 312 and the second polycrystalline silicon layer 314, respectively. As a result, conductive contacts 320 are made to the first polycrystalline silicon layer 312 and the second polycrystalline silicon layer 314, respectively.

Referring to FIG. 3F, as anti-reflective coating (ARC) layer 322, such as a silicon nitride layer or an amorphous silicon layer, is formed on the first 312 and second 314 polycrystalline silicon layers and on the conductive contacts 320. In an embodiment, an anneal process, such as an anneal process performed at a temperature of approximately 400° C., is performed subsequent to forming the ARC layer 322. In one embodiment, since the firing process has already been performed, the relatively lower temperature anneal process is sufficient for final annealing, and is not at such a high temperature as to diminish good passivation of the first 312 and second 314 polycrystalline silicon layers. Subsequent processing may include forming openings in the ARC layer 322 to expose portions of the conductive contacts 320 in order to make electrical contact to the conductive contacts 320. The resulting structure can be viewed as a completed or almost completed solar cell, which may be included in a solar module.

Figure 4A:
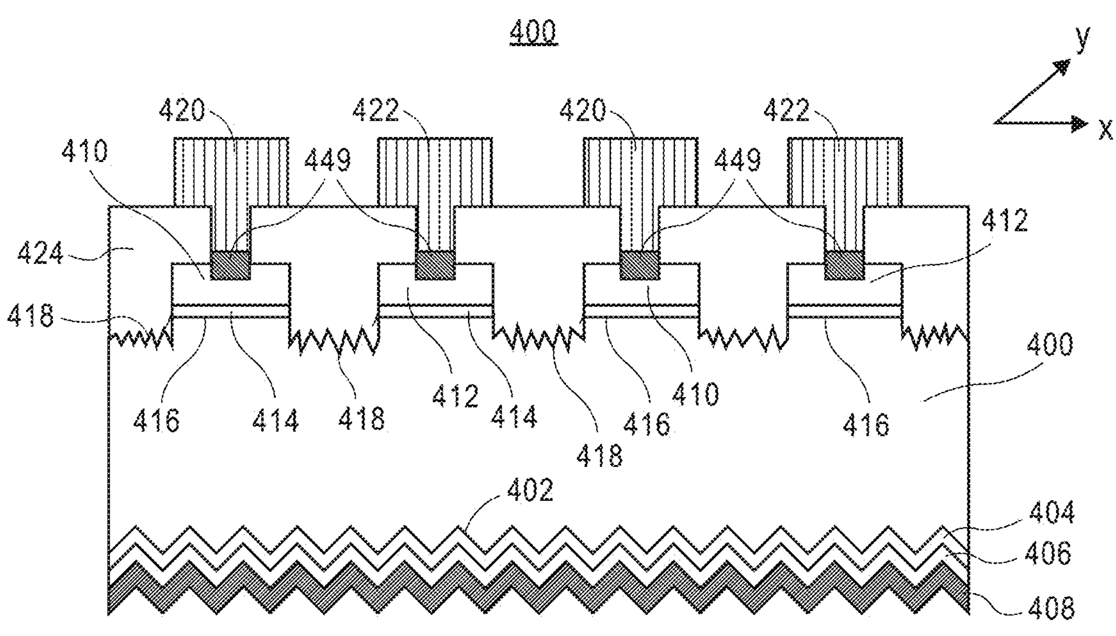
FIG. 4A illustrates a cross-sectional view of a portion of a back contact solar cell, in accordance with an embodiment of the present disclosure.

In another aspect, as a first exemplary back contact solar cell architecture, FIG. 4A illustrates a cross-sectional view of a portion of a back contact solar cell, in accordance with an embodiment of the present disclosure.

Referring to FIG. 4A, a solar cell 400 includes a substrate 401 having a light-receiving surface 402 and a back side surface opposite the light-receiving surface 402. A plurality of alternating N-type 410 and P-type 412 polycrystalline silicon emitter regions is on a dielectric layer 414 on a portion 416 of the back side surface of the substrate 401. In an embodiment, the substrate 401 is a monocrystalline silicon substrate. In an embodiment, dielectric layer 414 is a silicon oxide layer or silicon dioxide layer having a thickness of approximately 2 nanometers or less.

Referring again to FIG. 4A, an antireflective coating (ARC) layer 424 is over the plurality of alternating N-type 410 and P-type 412 polycrystalline silicon emitter regions. A plurality of conductive contact structures 420/449 and 422/449 is electrically coupled to the plurality of alternating N-type 410 and P-type 412 polycrystalline silicon emitter regions, respectively. Each of the plurality of conductive contact structures 420/449 or 422/449 includes a conductive structure 420 or 422 on a conductive contact 449 on a corresponding one of the alternating N-type 410 and P-type 412 polycrystalline silicon emitter regions. The conductive structure 420/449 or 422/449 is in an opening in the ARC layer 424 and extending over the ARC layer 424. The conductive contact 449 is beneath the conductive structure 420 or 422 in the opening and extending beneath a portion of the ARC layer 424 (i.e., along the y-direction, into and out of the page).

Referring again to FIG. 4A, in an embodiment, a passivating dielectric layer 404, such as a silicon oxide or silicon dioxide layer, is on the light-receiving surface 402 of the substrate 401. An optional intermediate material layer (or layers) 406, such as an amorphous silicon layer, is on the passivating dielectric layer 404. An anti-reflective coating (ARC) layer 408, such as a silicon nitride layer, is on the optional intermediate material layer (or layers) 406, as shown, or is on the passivating dielectric layer 404. In an embodiment, trenches 418 are between the alternating N-type 410 and P-type 412 polycrystalline silicon emitter regions. In one such embodiment, trenches 418 have a texturized surface, as is depicted.

Figure 4B:
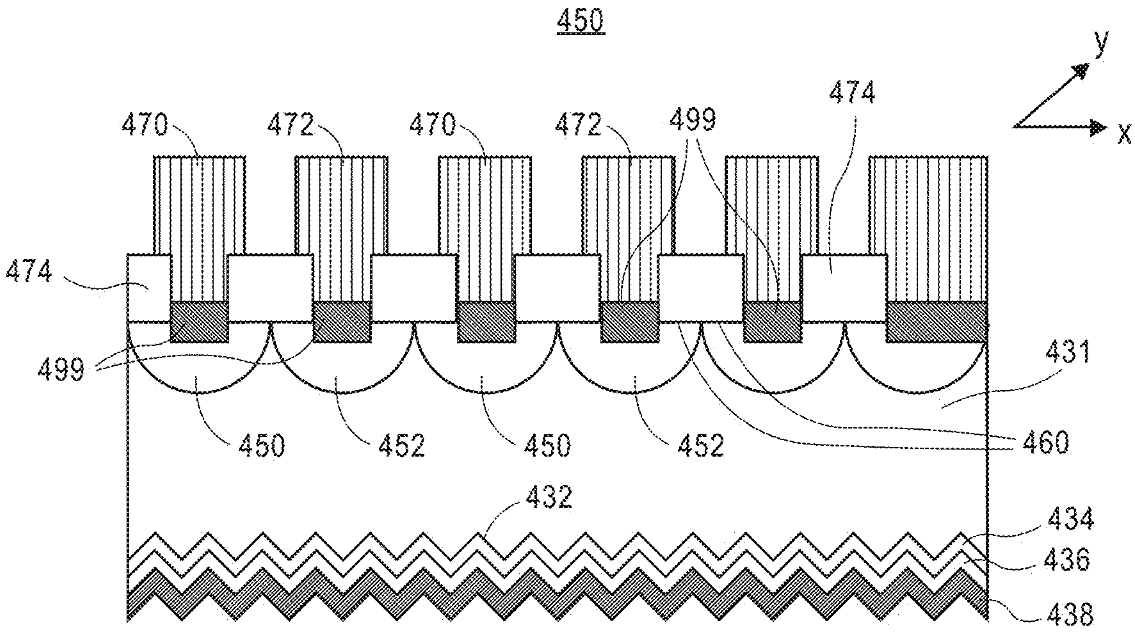
FIG. 4B illustrates a cross-sectional view of a portion of another back contact solar cell, in accordance with another embodiment of the present disclosure.

As a second exemplary back contact solar cell architecture, FIG. 4B illustrates a cross-sectional view of a portion of another back contact solar cell, in accordance with another embodiment of the present disclosure.

Referring to FIG. 4B, a solar cell 430 includes a substrate 431 having a light-receiving surface 432 and a back side surface 460 opposite the light-receiving surface 432. A plurality of alternating N-type 450 and P-type 452 emitter regions is within the substrate 431 at the back side surface 460 of the substrate 431.

Referring again to FIG. 4B, an antireflective coating (ARC) layer 474 is over the plurality of alternating N-type 450 and P-type 452 silicon emitter regions. A plurality of conductive contact structures 470/499 and 472/499 is electrically coupled to the plurality of alternating N-type 450 and P-type 452 silicon emitter regions, respectively. Each of the plurality of conductive contact structures 470/499 or 472/499 includes a conductive structure 470 or 472 on a conductive contact 499 on a corresponding one of the alternating N-type 450 and P-type 452 silicon emitter regions. The conductive structure 470/499 or 472/499 is in an opening in the ARC layer 474 and extending over the ARC layer 474. The conductive contact 499 is beneath the conductive structure 470 or 472 in the opening and extending beneath a portion of the ARC layer 474 (i.e., along the y-direction, into and out of the page).

Referring again to FIG. 4B, in an embodiment, a passivating dielectric layer 434, such as a silicon oxide or silicon dioxide layer, is on the light-receiving surface 432 of the substrate 431. An optional intermediate material layer (or layers) 436, such as an amorphous silicon layer, is on the passivating dielectric layer 434. An anti-reflective coating (ARC) layer 438, such as a silicon nitride layer, is on the optional intermediate material layer (or layers) 436, as shown, or is on the passivating dielectric layer 434.

One or more embodiments are directed to hybrid solar cells. To provide context, hybrid or differentiated architectures promise fewer process operations and simpler architecture while providing potential for high efficiencies. In particular, one or more embodiments described herein are directed to forming P+ and N+ polysilicon emitter regions for a solar cell where the respective structures of the P+ and N+ polysilicon emitter regions are different from one another. The resulting structure may provide a lower breakdown voltage and lower power losses associated as compared with other solar cell architectures.

Figure 5:
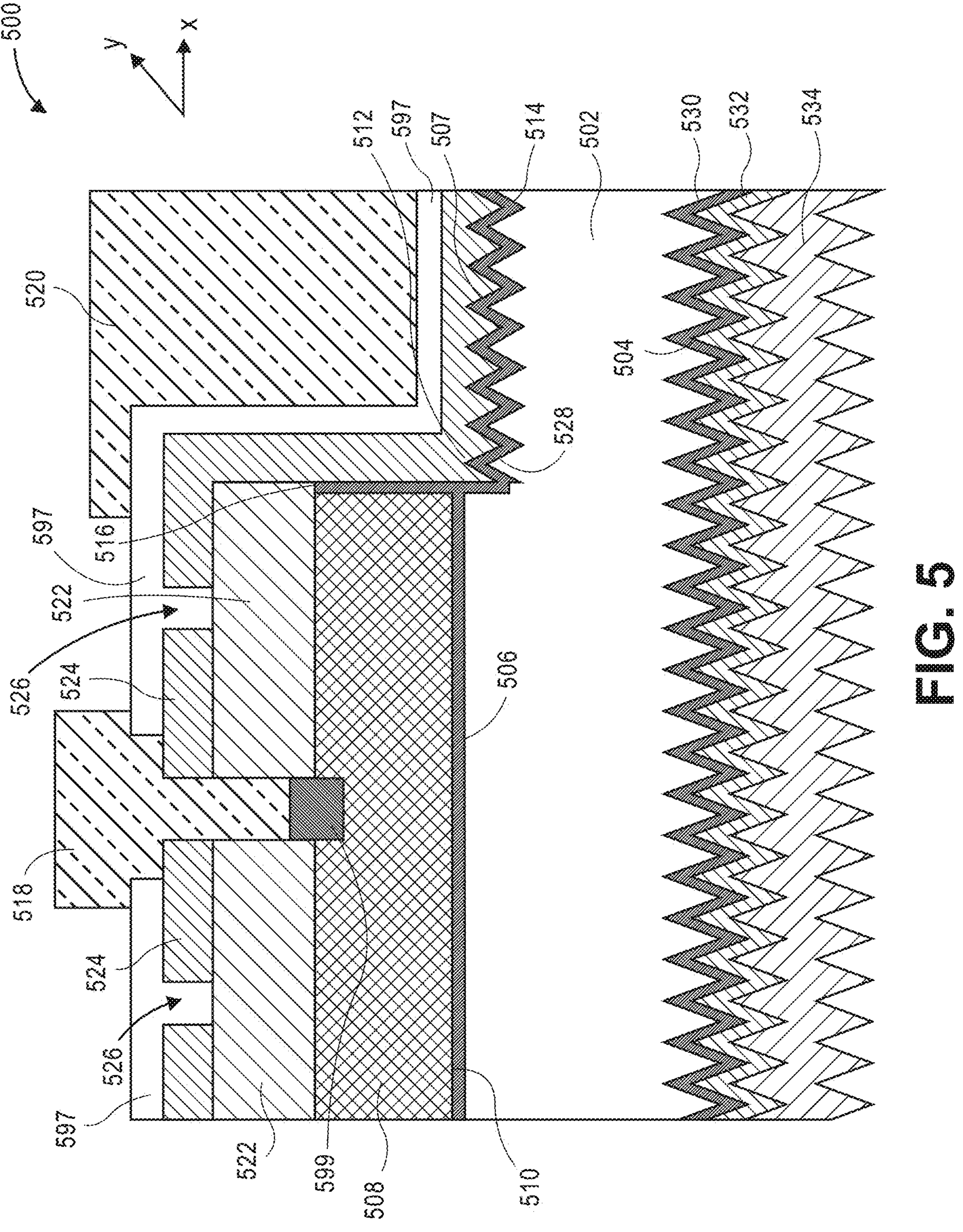
FIG. 5 illustrates a cross-sectional view of a portion of another back contact solar cell, in accordance with another embodiment of the present disclosure.

As a third exemplary back contact solar cell architecture, and as an example of a hybrid architecture, FIG. 5 illustrates a cross-sectional view of a portion of another back contact solar cell, in accordance with another embodiment of the present disclosure.

Referring to FIG. 5, a solar cell 500 includes a substrate 502 having a light-receiving surface 504 opposite a back side surface. A first polycrystalline silicon emitter region 508 of a first conductivity type is on a first thin dielectric layer 510 on a portion 506 of the back side surface of the substrate 502. A second polycrystalline silicon emitter region 512 of a second, different, conductivity type is on a second thin dielectric layer 514 in a trench 507 in the back side surface of the substrate 502. A portion of the second polycrystalline silicon emitter region 512 overlaps a portion of the first polycrystalline silicon emitter region 508.

Referring again to FIG. 5, an antireflective coating (ARC) layer 597 is over the first polycrystalline silicon emitter region 508 and the second polycrystalline silicon emitter region 512. A conductive contact structure 518/599 is electrically coupled to the first polycrystalline silicon emitter region 508. The conductive contact structure 518/599 includes a conductive structure 518 on a conductive contact 599 on the first polycrystalline silicon emitter region 508. The conductive structure 518 is in an opening in the ARC layer 597 and extends over the ARC layer 597. The conductive contact 599 is beneath the conductive structure 518 in the opening, and extends beneath a portion of the ARC layer 597 (e.g., along the y-direction, into and out of the page). In an embodiment, a conductive contact structure 520 is on the second polycrystalline silicon emitter region 512. Although not depicted, a portion of the conductive contact structure 520 may extend through an opening in the ARC layer 597 and make electrical contact to a conductive contact formed on the second polycrystalline silicon emitter region 512.

Referring again to FIG. 5, in an embodiment, the solar cell 500 further includes an insulator layer 522 on the first polycrystalline silicon emitter region 508. The first conductive structure 518 is through at least a portion of the insulator layer 522. Additionally, a portion of the second polycrystalline silicon emitter region 512 overlaps the insulator layer 522 but is separate from the first conductive structure 518. In an embodiment, an additional polycrystalline silicon layer 524 of the second conductivity type is on the insulator layer 522, and the first conductive structure 518 is through the polycrystalline silicon layer 524, as is depicted in FIG. 5. In one such embodiment, the additional polycrystalline silicon layer 524 and the second polycrystalline silicon emitter region 512 are formed from a same layer that is blanket deposited and then scribed to provide scribe lines 526 therein.

In an embodiment, the substrate 502 is a monocrystalline silicon substrate. In one embodiment, the first conductivity type is P-type, and the second conductivity type is N-type. In another embodiment, the first conductivity type is N-type, and the second conductivity type is P-type. In an embodiment, a third thin dielectric layer 516 is laterally directly between the first polycrystalline silicon emitter region 508 and the second polycrystalline silicon emitter region 512.

Referring again to FIG. 5, in an embodiment, the trench 507 has a texturized surface 528. In one such embodiment, the second polycrystalline silicon emitter region 512 and the second thin dielectric layer 514 are conformal with the texturized surface 528, as is depicted in FIG. 5. In other embodiments, the trench 507 is not texturized. In an embodiment, the solar cell 500 further includes a fourth thin dielectric layer 530 on the light-receiving surface 504 of the substrate 502. An N-type polycrystalline silicon layer 532 is on the fourth thin dielectric layer 532. An anti-reflective coating (ARC) layer 534, such as a layer of silicon nitride, is on the N-type polycrystalline silicon layer 532. In one such embodiment, the fourth thin dielectric layer 532 is formed by essentially the same process used to form the second thin dielectric layer 514.

In an embodiment, the substrate 502 is an N-type monocrystalline silicon substrate. In an embodiment, the first thin dielectric layer 510, the second thin dielectric layer 514 and the third thin dielectric layer 516 include silicon dioxide. However, in another embodiment, the first thin dielectric layer 510 and the second thin dielectric layer 514 include silicon dioxide, while the third thin dielectric layer 516 includes silicon nitride. In an embodiment, insulator layer 522 includes silicon dioxide.

Referring to FIGS. 4A, 4B and 5, in an embodiment, the fabrication of the conductive structures 420/422 or 470/472 or 518/520 involves adhering a metal foil or ribbon layer to the corresponding conductive contact 449, 499 or 599, respectively. In one such embodiment, the metal foil or ribbon is an aluminum (Al) foil or ribbon having a thickness approximately in the range of 5-100 microns. In one embodiment, the Al foil or ribbon is an aluminum alloy foil or ribbon including aluminum and second element such as, but not limited to, copper, manganese, silicon, magnesium, zinc, tin, lithium, or combinations thereof. In one embodiment, the Al foil or ribbon is a temper grade foil or ribbon such as, but not limited to, F-grade (as fabricated), O-grade (full soft), H-grade (strain hardened) or T-grade (heat treated). In one embodiment, the aluminum foil or ribbon is an anodized aluminum foil or ribbon. The metal foil or ribbon may subsequently be patterned, such as by laser ablation and/or etching.

Figure 6:
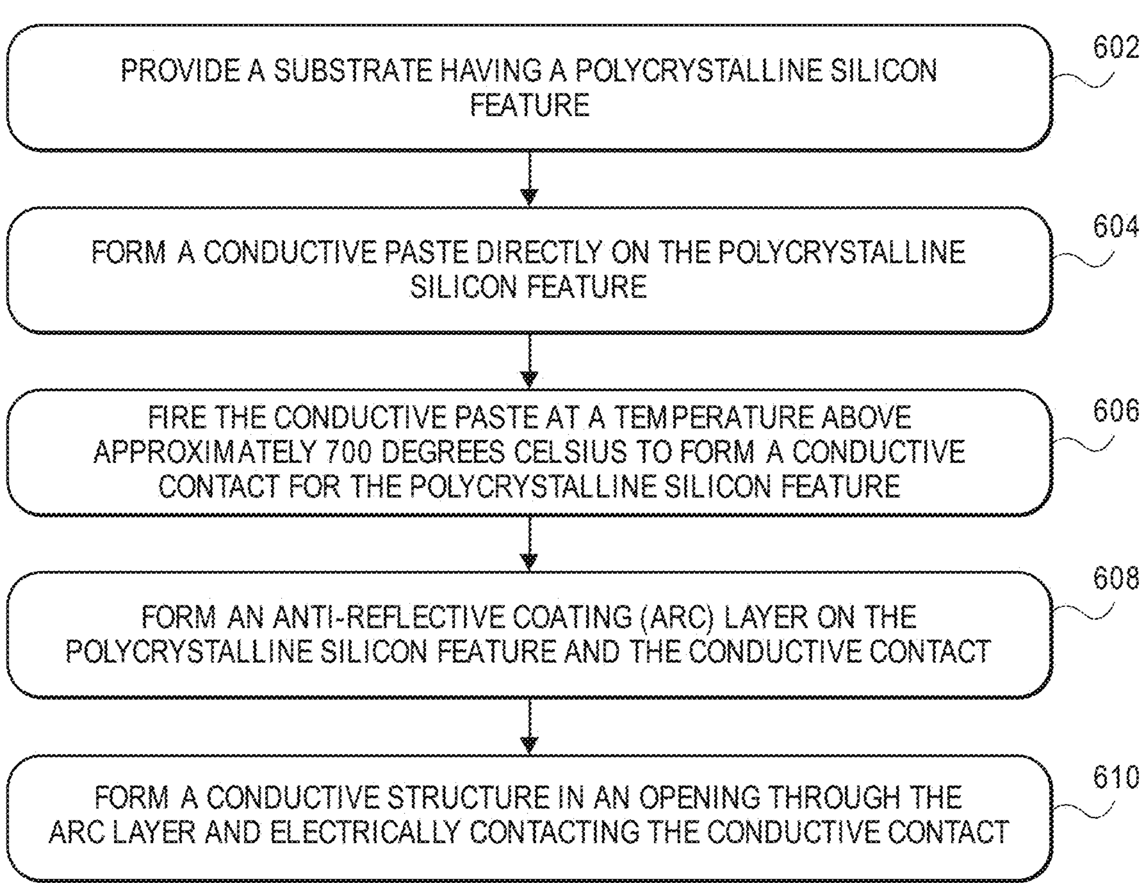
FIG. 6 is a flowchart representing various operations in a method of fabricating a solar cell, in accordance with an embodiment of the present disclosure.

FIG. 6 is a flowchart 600 representing various operations in a method of fabricating a solar cell, in accordance with an embodiment of the present disclosure. The method may be implemented to fabricated one or more of the solar cells described above.

Referring to operation 602 of flowchart 600, a method of fabricating a solar cell includes providing a substrate having a polycrystalline silicon feature. At operation 604, a conductive paste is formed directly on the polycrystalline silicon feature, such as by printing a paste including silver (Ag) particles on the polycrystalline silicon feature. At operation 606, the conductive paste is fired at a temperature above approximately 700° C., such as between 700 and 800° C., to form a conductive contact for the polycrystalline silicon feature. At operation 608, subsequent to firing the conductive paste, an anti-reflective coating (ARC) layer, such as a layer including silicon nitride or amorphous silicon, is formed on the polycrystalline silicon feature and the conductive contact. At operation 610, a conductive structure is formed in an opening through the ARC layer and electrically contacting the conductive contact.

It is to be appreciated that one or more processes described above may be implemented to fabricate a solar cell. The above described processes may be implemented in their entirety or portions of the one or more processes described above may be implemented to fabricate a solar cell.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be appreciated that, where the ordering of P+ and then N+ type doping is described specifically for emitter regions on a back surface of a solar cell, other embodiments contemplated include the opposite ordering of conductivity type, i.e., N+ and then P+ type doping, respectively. In other embodiments, a P-type doped substrate is used in place of an N-type doped substrate. In other embodiments, the above described approaches can be applicable to manufacturing of other than solar cells. For example, manufacturing of light emitting diode (LEDs) may benefit from approaches described herein.

Thus, methods of fabricating conductive contacts for polycrystalline silicon features of solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:

forming a substrate having first and second opposing light-receiving surfaces, the first light-receiving surface above the second light-receiving surface;

forming a first tunnel dielectric layer on the first light-receiving surface;

forming a second tunnel dielectric layer on the second light-receiving surface;

forming an N-type polycrystalline silicon layer on the first tunnel dielectric layer;

forming a P-type polycrystalline silicon layer on the second tunnel dielectric layer;

forming a first non-conductive antireflective coating (ARC) layer on the N-type polycrystalline silicon layer;

forming a second non-conductive ARC layer on the P-type polycrystalline silicon layer;

forming a first set of conductive contact structures directly coupled to the N-type polycrystalline silicon layer, a portion of each of the first set of conductive contact structures vertically between the first non-conductive ARC layer and the N-type polycrystalline silicon layer, wherein the portion of each of the first set of conductive contact structures vertically separates the first non-conductive ARC layer from the N-type polycrystalline silicon layer, and wherein an uppermost surface of each of the first set of conductive contact structures is in direct contact with the first non-conductive ARC layer, and wherein a lowermost surface of each of the first set of conductive contact structures is in direct contact with the N-type polycrystalline silicon layer, wherein the lowermost surface of each of the first set of conductive contact structures is opposite the uppermost surface of each of the first set of conductive contact structures, and wherein the lowermost surface of each of the first set of conductive contact structures is parallel with the uppermost surface of each of the first set of conductive contact structures; and forming a second set of conductive contact structures directly coupled to the P-type polycrystalline silicon layer, a portion of each of the second set of conductive contact structures vertically between the second non-conductive ARC layer and the P-type polycrystalline silicon layer, wherein the portion of each of the second set of conductive contact structures vertically separates the second non-conductive ARC layer from the P-type polycrystalline silicon layer, and wherein a lowermost surface of each of the second set of conductive contact structures is in direct contact with the second non-conductive ARC layer, and wherein an uppermost surface of each of the second set of conductive contact structures is in direct contact with the P-type polycrystalline silicon layer, wherein the uppermost surface of each of the second set of conductive contact structures is opposite the lowermost surface of each of the second set of conductive contact structures, and wherein the uppermost surface of each of the second set of conductive contact structures is parallel with the lowermost surface of each of the second set of conductive contact structures.

2. The method of claim 1, wherein the first light-receiving surface is texturized.

3. The method of claim 2, wherein the second light-receiving surface is texturized.

4. The method of claim 1, wherein a conductive contact of each of the first set of conductive contact structures comprises silver (Ag).

5. The method of claim 4, wherein a conductive contact of each of the second set of conductive contact structures comprises silver (Ag).

6. The method of claim 1, wherein the first and second non-conductive ARC layers comprise silicon nitride.

7. The method of claim 1, wherein the substrate is a monocrystalline silicon substrate.

8. The method of claim 1, wherein the first and second tunnel dielectric layers are silicon oxide layers.

* * * * *